(12) United States Patent
Shih et al.

(10) Patent No.: US 12,322,645 B2
(45) Date of Patent: Jun. 3, 2025

(54) METHOD FOR FABRICATING PHYSICALLY UNCLONABLE FUNCTION DEVICE

(71) Applicant: UNITED MICROELECTRONICS CORP., Hsin-Chu (TW)

(72) Inventors: Ping-Chia Shih, Tainan (TW); Che-Hao Kuo, Tainan (TW); Ssu-Yin Liu, Kaohsiung (TW); Ching-Hua Yeh, Tainan (TW); I-Hsin Sung, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 472 days.

(21) Appl. No.: 17/687,692

(22) Filed: Mar. 7, 2022

(65) Prior Publication Data
US 2023/0260827 A1 Aug. 17, 2023

(30) Foreign Application Priority Data
Feb. 11, 2022 (CN) .......................... 202210128114.9

(51) Int. Cl.
*H01L 21/762* (2006.01)
*H01L 21/311* (2006.01)
*H01L 21/3115* (2006.01)
*H01L 21/3213* (2006.01)
*H01L 23/00* (2006.01)

(52) U.S. Cl.
CPC .. *H01L 21/76224* (2013.01); *H01L 21/31144* (2013.01); *H01L 21/31155* (2013.01); *H01L 21/32139* (2013.01); *H01L 23/573* (2013.01)

(58) Field of Classification Search
CPC ................... H01L 21/76224; H01L 21/32139
See application file for complete search history.

(56) References Cited

U.S. PATENT DOCUMENTS

| | | | |
|---|---|---|---|
| 6,524,938 B1* | 2/2003 | Tao | H01L 21/28247 257/E21.252 |
| 6,949,785 B2* | 9/2005 | Tu | H10B 12/038 257/E21.651 |
| 9,379,184 B1* | 6/2016 | Cao | H01L 29/772 |
| 10,027,480 B2 | 7/2018 | Lee et al. | |
| 2006/0046390 A1* | 3/2006 | Shih | H01L 29/42344 438/257 |
| 2015/0154421 A1* | 6/2015 | Feng | G06F 21/73 726/34 |
| 2018/0205563 A1* | 7/2018 | Takaoka | H04L 9/3278 |

FOREIGN PATENT DOCUMENTS

CN 108695329 B * 11/2020 ............. H01L 21/76

* cited by examiner

*Primary Examiner* — Walter H Swanson
*Assistant Examiner* — Jacob T Nelson
(74) *Attorney, Agent, or Firm* — Winston Hsu

(57) ABSTRACT

A method for fabricating a physically unclonable function (PUF) device includes the steps of first defining a PUF cell region on a substrate and then performing a process to form a defect on the PUF cell region. Preferably, the formation of the defect could be accomplished by forming a shallow trench isolation (STI) on the substrate, forming a gate material layer on the substrate and the STI, patterning the gate material layer to form a first gate material layer and a second gate material layer, and then forming an epitaxial layer between and connecting the first gate material layer and the second gate material layer.

2 Claims, 5 Drawing Sheets

METHOD FOR FABRICATING PHYSICALLY UNCLONABLE FUNCTION DEVICE

BACKGROUND OF THE INVENTION

1. Field of the Invention

The invention relates to a method for fabricating a physically unclonable function (PUF) device.

2. Description of the Prior Art

Even though integrated circuits are usually fabricated by similar processes with same materials, each of the integrated circuits could still have a unique feature or variation specific to itself. In recent years, researchers have come up with physical unclonable function (PUF) devices that utilizes specific variations in integrated circuits as a unique feature similar to human DNA. Due to its nature of randomness, the output of PUF devices are very difficult to predict thereby increasing its level of security.

SUMMARY OF THE INVENTION

According to an embodiment of the present invention, a method for fabricating a physically unclonable function (PUF) device includes the steps of first defining a PUF cell region on a substrate and then performing a process to form a defect on the PUF cell region. Preferably, the formation of the defect could be accomplished by forming a shallow trench isolation (STI) on the substrate, forming a gate material layer on the substrate and the STI, patterning the gate material layer to form a first gate material layer and a second gate material layer, and then forming an epitaxial layer between and connecting the first gate material layer and the second gate material layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
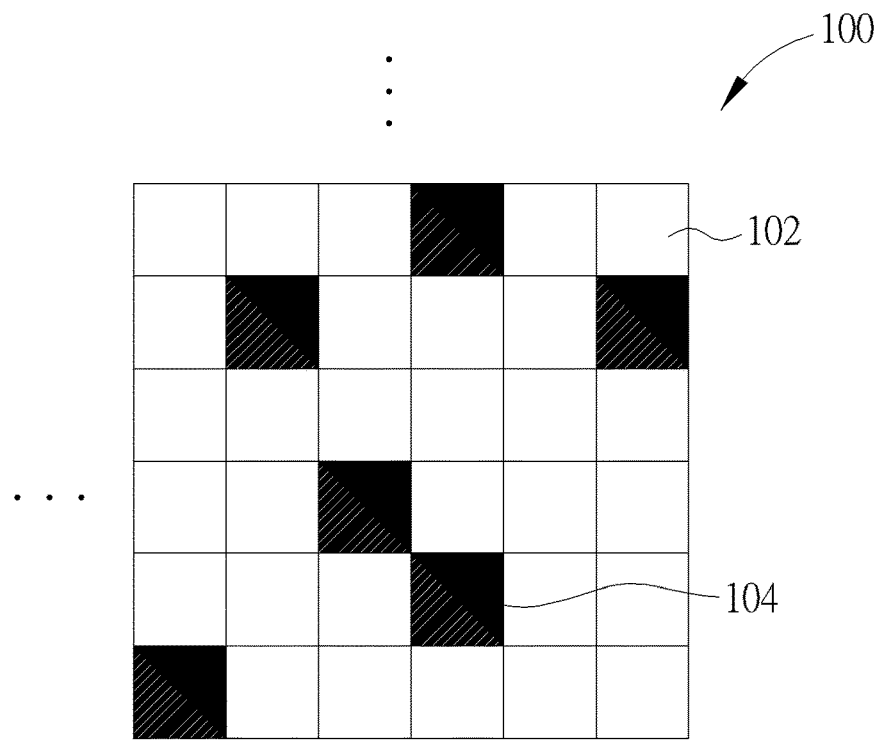
FIG. 1 illustrates a perspective view of a PUF device according to an embodiment of the present invention.
Figure 2:
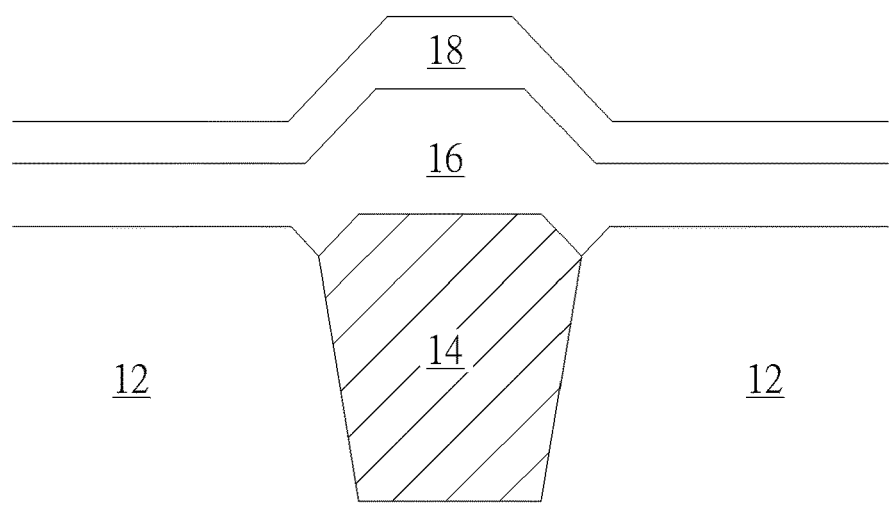
FIGS. 2-7 illustrate a method for fabricating a cell region with defects of a PUF device according to an embodiment of the present invention.

Referring to FIG. 1, FIG. 1 illustrates a perspective view of a PUF device according to an embodiment of the present invention. As shown in FIG. 1, the PUF device preferably includes a PUF array 100, which further includes a plurality of cell regions 102 carrying normal function and a plurality of cell regions 104 with defects. Referring to FIGS. 2-7, FIGS. 2-7 illustrate a method for fabricating a cell region 104 with defects of a PUF device according to an embodiment of the present invention. As shown in FIG. 2, a semiconductor substrate 12 made of semiconductor material including but not limited to for example silicon, germanium, silicon-germanium compounds, silicon carbide, or gallium arsenide is provided. Next, a shallow trench isolation (STI) 14 is formed in the substrate 12 to define a plurality of transistor regions having different conductive types. In this embodiment, the STI 14 is preferably made of silicon oxide, but not limited thereto. Next, an oxide growth process or more specifically a rapid thermal oxidation (RTO) process or an in-situ steam generation (ISSG) process is conducted to form a gate dielectric (not shown) made of silicon oxide on the substrate 12 and covering the surface of the substrate 12 and STI 14.

Next, a gate structure is formed on the substrate 12. In this embodiment, the formation of the gate structure could be accomplished by a gate first process, a high-k first approach from gate last process, or a high-k last approach from gate last process. Since this embodiment pertains to a gate first approach, a gate material layer 16 preferably made of polysilicon and a hard mask 18 made of silicon nitride (SiN) or silicon oxide could be formed sequentially on the gate dielectric layer or substrate. It should be noted that since the STI 14 is protruding above the surface of the substrate 12, the top surface of the gate material layer 16 and hard mask 18 disposed on top of the STI 14 is also slightly higher than the top surface of gate material layer 16 and hard mask 18 disposed adjacent to two sides of the STI 14.

Figure 3:
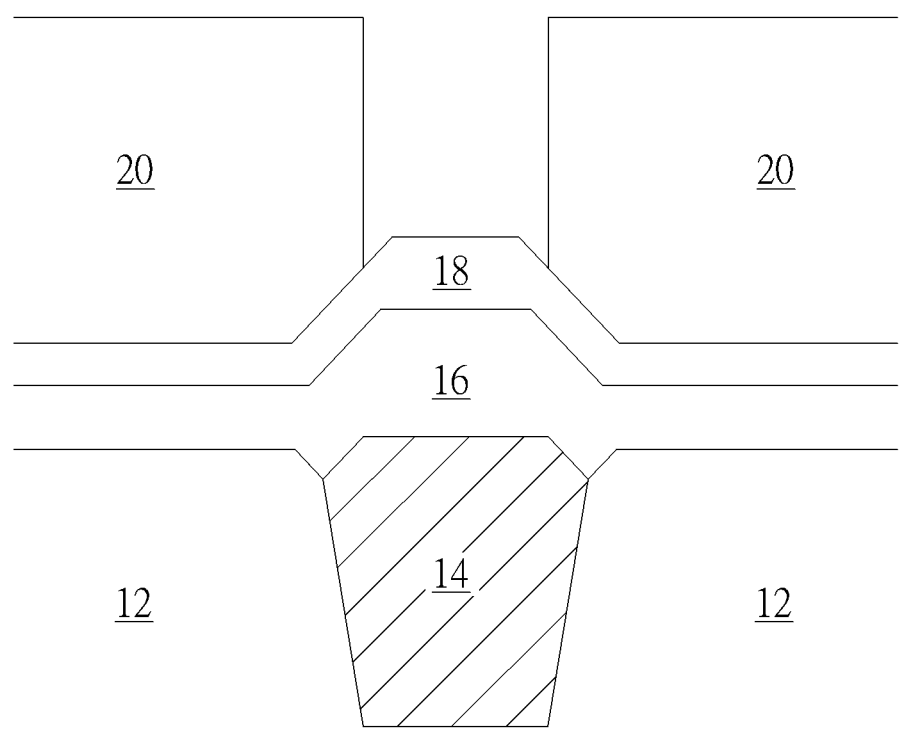

Next, as shown in FIG. 3, a patterned mask 20 such as a patterned resist is formed on the hard mask 18, in which the patterned mask 20 includes an opening exposing the top surface of the hard mask 18.

Figure 4:
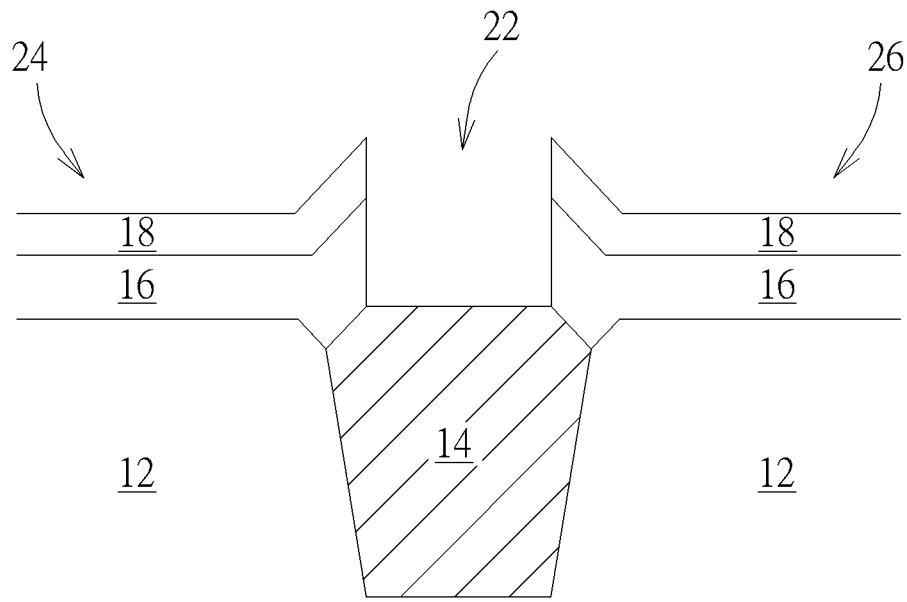

Next, as shown in FIG. 4, a pattern transfer process is conducted by using the patterned mask 20 as mask to remove part of the hard mask 18, part of the gate material layer 16, and even part of the gate dielectric layer through single or multiple etching processes for forming an opening 22 exposing the top surface of the STI 14. After stripping the patterned mask 20, gate structures 24, 26 each made of a patterned gate material layer 16 and a patterned hard mask 18 are formed on the substrate 12 adjacent to two sides of the STI 14, in which each patterned gate material layer 16 preferably becomes a gate electrode for each region.

Figure 5:
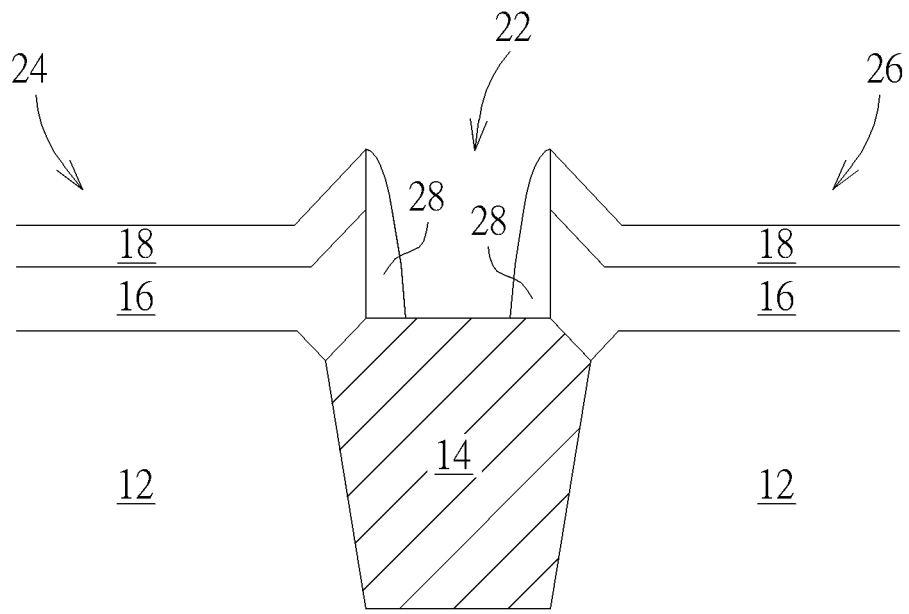

Next, as shown in FIG. 5, at least a spacer 28 is formed on sidewalls of the gate structures 24, 26. In this embodiment, the spacer 28 could be a single spacer or a composite spacer, in which the spacer 28 could further include an offset spacer (not shown) and a main spacer (not shown). The offset spacer and the main spacer are preferably made of different materials while the offset spacer and main spacer could all be selected from the group consisting of $SiO_2$, SiN, SiON, and SiCN, but not limited thereto.

Figure 6:
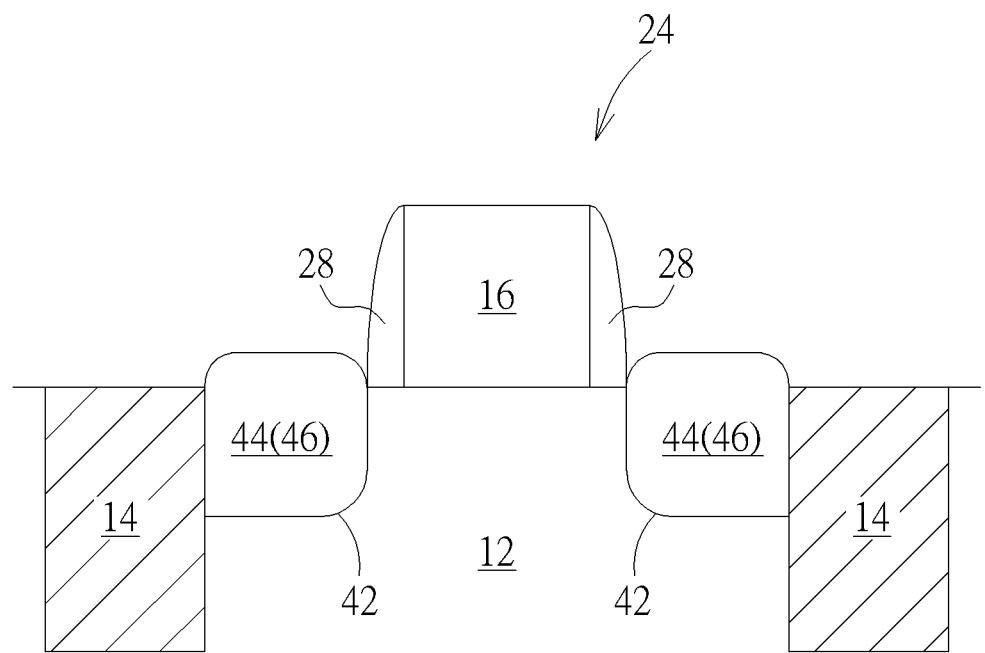
Figure 7:
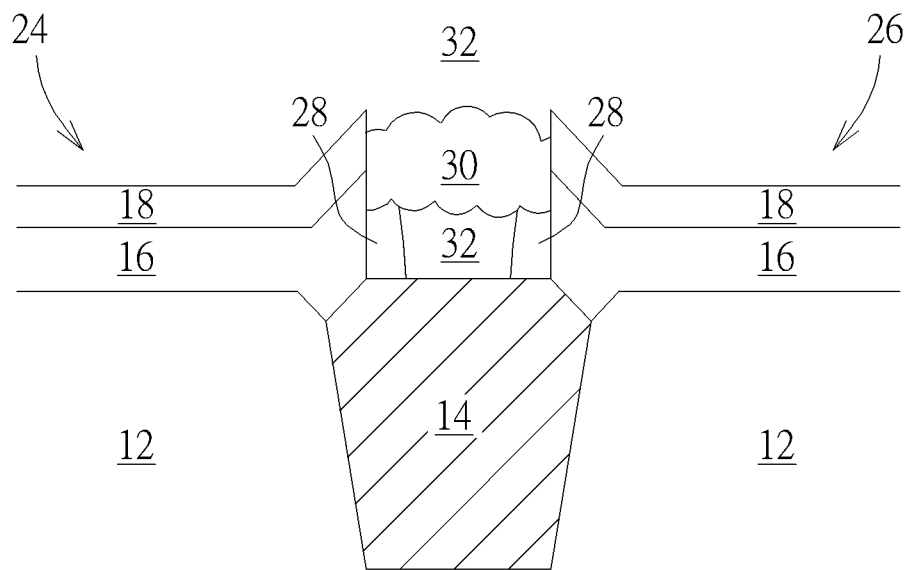

Referring to FIGS. 6-7, FIGS. 6-7 illustrate a method for fabricating the PUF device taken from different views following FIG. 5 according to an embodiment of the present invention. As shown in FIG. 6, a dry etching and/or wet etching process could be conducted by using the gate structures 24, 26 and the spacer 28 as mask to remove part of the substrate 12 for forming recesses 42 adjacent to two sides of the gate structures 24, 26. Next, a selective epitaxial growth (SEG) process is conducted to form epitaxial layers 44 in the recesses 42 as shown in FIG. 6 and at the same time form an epitaxial layer 30 on sidewalls of the gate material layer 16 directly above the STI 14 for connecting the two gate structures 24, 26 as shown in FIG. 7. It should be noted that even though epitaxial layers 44 formed in the substrate 12 adjacent to two sides of the gate structure 24 is disclosed in FIG. 6, it would also be desirable to apply the same process for forming epitaxial layers 44 in the substrate 12 adjacent to two sides of the gate structure 26, which is also within the scope of the present invention.

Viewing from a more detailed perspective, when the etching process is conducted to remove part of the substrate 12 for forming the recesses 42 as shown in FIG. 6, part of the top portion of the spacers 28 directly on top of the STI 14 shown in FIG. 7 is removed at the same time to expose the sidewalls of the gate material layer 16 or gate electrode made of polysilicon and/or sidewalls of the hard mask 18. Since the sidewalls of the gate material layers 16 of the two gate structures 24, 26 are exposed before the SEG process is conducted, the epitaxial growth process conducted afterwards would not only form epitaxial layers 44 in the substrate 12 adjacent to two sides of the gate structures 24, 26 as shown in FIG. 6 but also form epitaxial layer 30 on the exposed gate material layer 16 sidewall surfaces directly on top of the STI 14 as shown in FIG. 7 as the epitaxial layer 30 would be formed outwards and connect the two gate material layers 16. In other words, an epitaxial layer 30 shaping as a bridge would be formed directly on top of the STI 14 during the epitaxial growth process to connect and directly contacting the gate material layer 16 and hard mask 18 from the gate structure 24 on left side and the gate material layer 16 and hard mask 18 from the gate structure 26 on right side as the epitaxial layer 30 preferably not contacting the STI 14 underneath directly.

It should be noted that the epitaxial layer 30 is formed between two gate structures 24, 26 in this embodiment to establish a connection between two gate structures 24, 26 that are not supposed to be connected. This thereby forms a defect and this defect then becomes an unique feature or unclonable characteristic for the chip or PUF device shown in FIG. 1.

In this embodiment, the epitaxial layers 30, 44 could be formed to include different materials depending on the type of transistor being fabricated. For instance, if the MOS transistor being fabricated were to be a PMOS transistor, the epitaxial layers 30, 44 could be made of material including but not limited to for example SiGe, SiGeB, or SiGeSn. If the MOS transistor being fabricated were to be a NMOS transistor, the epitaxial layers 30, 44 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layers 30, 44 is preferred to have less or no germanium atom at all to facilitate the formation of silicide afterwards. Next, one or more ion implantation process could be conducted to form source/drain regions 46 in the substrate 12 adjacent to two sides of the gate structures 24, 26.

According to an embodiment of the present invention, the source/drain regions 46 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain regions 46. Moreover, the dopants within the source/drain regions 46 could also be formed with a gradient, which is also within the scope of the present invention.

Next, a contact etch stop layer (CESL) made of silicon nitride could be selectively formed on the substrate 12 to cover the gate structures 24, 26, and then an interlayer dielectric (ILD) layer 32 is formed on the CESL. It should be noted that since the epitaxial layer 30 formed directly on top of the STI 14 for connecting the two gate structures 24, 26 does not contact the STI 14 underneath thereby forming a void between the STI 14 and the epitaxial layer 30, the ILD layer 32 formed on the substrate 12 and covering the gate structures 24, 26 at this stage would also fill the void between the STI 14 and epitaxial layer 30 completely at the same time. Nevertheless, it should also be noted that even though the void between the STI 14 and epitaxial layer 30 is filled with ILD layer 32 in this embodiment, according to other embodiment of the present invention, it would also be desirable to only form the ILD layer 32 on the gate structures 24, 26 without filling the void, which is also within the scope of the present invention. Next, follow-up process could be carried out by performing a replacement metal gate (RMG) process to transform the gate structures 24, 26 into metal gates or directly forming contact plugs adjacent to two sides of the gate structures 24, 26 for connecting the source/drain regions. This completes the process for fabricating a PUF device according to an embodiment of the present invention.

Figure 8:
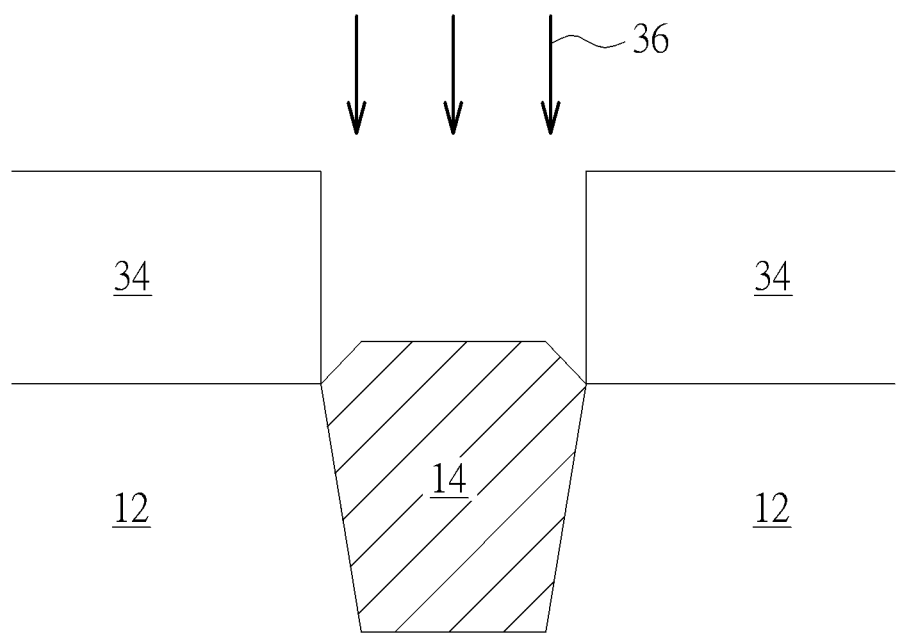
FIG. 8 illustrates a method for fabricating a PUF device according to an embodiment of the present invention.

Referring to FIG. 8, FIG. 8 illustrates a method for fabricating a PUF device according to an embodiment of the present invention. As shown in FIG. 8, in contrast to the aforementioned embodiment of forming the gate material layer 16 made of polysilicon immediately after the STI 14 is formed, it would be desirable to first form a patterned mask 34 such as patterned resist on the substrate 12 for exposing the surface of the STI 14 before forming the gate material layer 16 and then conduct a deep etching process 36 or treatment by applying diluted hydrofluoric acid (dHF) on the STI 14 for forming a defect. This defect then becomes an unique feature or unclonable characteristic for the chip or PUF device shown in FIG. 1. Next, follow-up process could be conducted as shown in FIGS. 2-7 to form gate structures 24, 26 on the substrate 12 and details of which are not explained herein for the sake of brevity.

Figure 9:
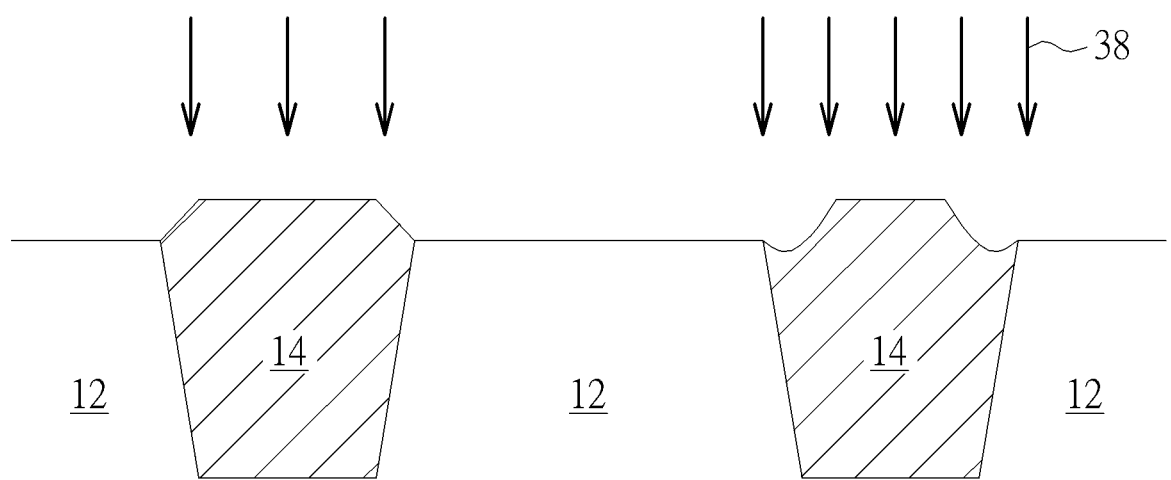
FIG. 9 illustrates a method for fabricating a PUF device according to an embodiment of the present invention.

Referring to FIG. 9, FIG. 9 illustrates a method for fabricating a PUF device according to an embodiment of the present invention. As shown in FIG. 9, it would also be desirable to conduct a heavy dosage ion implantation process 38 through Boolean approach on the STI 14 (such as the STI 14 on the right side of FIG. 9) before forming the gate material layer 16 without using any patterned mask. Preferably, the ion implantation process 38 could be achieved by implanting ions such as germanium (Ge) or arsenic (As) into the STI 14 so that defect such as cavities or recesses could be formed more easily on edge portion of the STI 14 in the later etching process and this defect then becomes an unique feature or unclonable characteristic for the chip or PUF device shown in FIG. 1. Next, follow-up process could be conducted as shown in FIGS. 2-7 to form gate structures 24, 26 on the substrate 12 and details of which are not explained herein for the sake of brevity.

Overall, the present invention preferably discloses an approach for fabricating PUF device by first defining one or more PUF cell regions on a substrate and then performing a process to form a defect on at least one PUF cell region. According to an embodiment of the present invention, it would be desirable to form an epitaxial layer 30 between two gate structures 24, 26 and by connecting and conducting the two adjacent gate structures 24, 26 a defect could be formed. Moreover, it would also be desirable to conduct an etching process by using a patterned mask to conduct an etching process on the STI 14 for forming a defect, or conduct a heavy ion implantation process 38 through Boolean approach to implant ions such as germanium (Ge) or arsenic (As) into the STI 14 so that defect such as cavities could be formed on the edge of the STI 14 in the later etching process. All of the above three approaches for forming defects could all be used as an unique feature or unclonable characteristic for the PUF device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a physically unclonable function (PUF) device, comprising:
    defining a PUF array on a substrate, wherein the PUF array comprises a first cell region carrying normal function and a second cell region with defects; and
    performing a process to form a defect on the second cell region, wherein the process comprises:
        forming a shallow trench isolation (STI) on the substrate;
        forming a patterned mask on the substrate; and
        performing an etching process to remove part of the STI for forming the defect on the second cell region.

2. A method for fabricating a physically unclonable function (PUF) device, comprising:
    defining a PUF array on a substrate, wherein the PUF array comprises a first cell region carrying normal function and a second cell region with defects; and
    performing a process to form a defect on the second cell region, wherein the process comprises:
        forming a shallow trench isolation (STI) on the substrate;
        performing an ion implantation process on the STI; and
        performing an etching process to remove part of the STI for forming the defect on the second cell region.

* * * * *